(12) United States Patent
Paterson

(10) Patent No.: US 9,391,614 B2
(45) Date of Patent: Jul. 12, 2016

(54) CLOCK STATE CONTROL FOR POWER SAVING IN AN INTEGRATED CIRCUIT

(71) Applicant: ARM LIMITED, Cambridge (GB)

(72) Inventor: Richard Paterson, Sheffield (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/445,205

(22) Filed: Jul. 29, 2014

(65) Prior Publication Data

US 2016/0036440 A1     Feb. 4, 2016

(51) Int. Cl.
*H03K 3/037*          (2006.01)
*H03K 19/00*          (2006.01)

(52) U.S. Cl.
CPC ............ *H03K 19/0016* (2013.01); *H03K 3/037* (2013.01)

(58) Field of Classification Search
CPC ........ G11C 19/00; G11C 19/28; H03K 19/00; H03K 19/0016; H03K 3/00; H03K 3/013; H03K 3/037; H03K 3/0375; H03K 3/286
USPC ....................................................... 327/225
See application file for complete search history.

(56) References Cited

U.S. PATENT DOCUMENTS

| 5,550,499 | A  | * | 8/1996  | Eitrheim | H03K 5/1565 |
|           |    |   |         |          | 327/175     |
| 2008/0301594 | A1 | * | 12/2008 | Jiang  | G06F 17/5031 |
|           |    |   |         |          | 716/134     |
| 2012/0182056 | A1 | * | 7/2012  | Dally  | H03K 3/356139 |
|           |    |   |         |          | 327/202     |

OTHER PUBLICATIONS

Abdollahi et al., "Leakage Current Reduction in CMOS VLSI Circuits by Input Vector Control", *IEEE Transactions on very large scale integration (VLSI) Systems*, vol. 12, No. 2, Feb. 2004, pp. 140-154.

* cited by examiner

*Primary Examiner* — John Poos
*Assistant Examiner* — David Mattison
(74) *Attorney, Agent, or Firm* — Pramudji Law Group PLLC; Ari Pramudji

(57) ABSTRACT

Sequential logic elements may consume less static power in response to a first state of a clock signal than in response to a second state of a clock signal (the first and second state may be either low or high depending on the type of sequential logic). This can be exploited to reduce static power consumption of an integrated circuit by controlling the level of a clock signal so that is in the first state for a greater amount of time than the second state.

19 Claims, 6 Drawing Sheets

CLOCK STATE CONTROL FOR POWER SAVING IN AN INTEGRATED CIRCUIT

BACKGROUND

1. Technical Field

The present technique relates to the field of integrated circuits.

2. Technical Background

Static power consumption is an increasing problem for integrated circuit design, as process geometries get smaller. While dynamic power requirements have to an extent scaled with process geometry, static power has increased as density has increased and feature size has decreased. Therefore, it is desirable to reduce the static power consumption of an integrated circuit.

SUMMARY

Viewed from one aspect, the present technique provides an integrated circuit comprising:

at least one sequential logic element; and clock supply circuitry configured to supply a clock signal to the at least one sequential logic element;

wherein in response to a first state of the clock signal, the at least one sequential logic element is configured to consume less static power than in response to a second state of the clock signal; and the clock supply circuitry is configured to supply the clock signal to the at least one sequential logic element in the first state for a greater amount of time than the second state.

An integrated circuit may include sequential logic elements, such as flip-flops. The inventor of the present technique recognised that sequential elements typically have a relationship between the state of their inputs (whether they are high or low) and the amount of static power that is consumed by the sequential logic element. This means that when a clock signal for a sequential logic element is in a first state (either high or low), the logic element may consume less static power than when the clock signal is in a second state (the other state). This can be exploited to reduce overall static power consumption of the circuit. By supplying the clock signal to at least one sequential logic element in the first state for a greater amount of time than the second state, overall static power consumption can be reduced. This is very useful since leakage can be reduced without significantly altering the design requirements of the integrated circuit.

The sequential logic element may be any synchronous element whose output depends on an input signal and also depends on a previous output of the logic element. The clock signal may be used to select when the output signal transitions in response to the input signal. For example, the sequential logic element may be a latch or a flip flop. The present technique may be particularly useful for D flip-flops, of which there are typically many in an integrated circuit design. Even if the leakage saving on an individual sequential logic element is very small, an integrated circuit may include hundreds of thousands of sequential logic elements and so the cumulative effect can be significant over the entire circuit. A sequential logic element differs from a combinatorial logic element (such as a logic gate) in that its output depends on at least one input signal and a previous output of the sequential logic element in a previous clock cycle, while combinatorial logic elements generate an output which depends only on the combination of inputs and is independent of the previous output signal.

One reason why the sequential logic element may consume less static power in response to one state of the clock signal than the other may be that the sequential logic element has different numbers of transistors in an active state when the clock is high to when the clock is low. Hence, the first state may be the state of the clock signal in which the sequential logic element has fewer active transistors than the second state. When fewer transistors are active, there is less leakage and so less static power consumption.

Also, when fewer transistors are in an active state, there is less wear on the transistors. Therefore, clocking the sequential logic element in the state in which fewer transistors are active more often than the opposite state may also increase the working lifetime of the integrated circuit by reducing wear or aging of the sequential logic element.

Not all sequential logic elements in the integrated circuit need to be provided with a clock signal which is in the first state for more time than the second state. There may be at least one other sequential logic element which is supplied with a clock signal which is in the first and second state for equal time or in which the second state is used more often than the first state. For example, there may be some types of sequential logic element which are not suitable for being provided with a clock signal in the first state more often than the second state, and so these can be provided with a different kind of clock signal.

Also, the clock signal does not always need to be supplied in the first state more often than the second state. It may be possible to supply this type of clock signal only during a selected mode of operation (such as a power saving mode) or in response to a particular event, with a more balanced clock signal which is equally likely to be in the first state and the second state being supplied at other times.

The clock supply circuitry may take different forms. In some cases the clock supply circuitry may include a clock generator. In other cases the clock supply circuitry may receive a clock signal from a separate clock generator and then supply it across the integrated circuit to the at least one sequential logic element. For example, the clock supply circuitry may be a portion of a clock tree.

There are various ways in which the clock signal can be controlled to be in the first state for more time than the second state. In some cases the clock supply circuitry may vary the duty cycle (or mark space ratio) of the clock signal so that it is in the first state for a greater fraction of each clock cycle in a second state. Hence, instead of a 50% duty cycle as with normal clock signals, the clock supply circuitry may provide a clock signal with a duty cycle other than 50% with the clock in the first state for more than half of each clock cycle.

In some cases the clock supply circuitry may actually generate the clock signal using the clock generating circuitry and the clock generating circuitry may ensure that the signal is generated with a non-50% duty cycle. In other cases the clock supply circuitry may receive a clock signal that has a 50% duty cycle but may have adjustment circuitry which then adjusts a duty cycle (mark space ratio) of the clock signal so that the clock signal is in the first state for a greater fraction of each cycle than the second state.

However, in practice existing clock generating circuits may already have the capability of generating a clock signal with a non-50% duty cycle, but this is not exploited in known clock generators. This is because clock generators may initially generate a temporary clock signal which has a short pulse generated at the required frequency of a clock signal but whose pulse width is less than 50% of the clock period. The clock generator may then have pulse extending circuitry which extends the width of the pulse so that the clock signal then has a 50% duty cycle (where the first and second states are selected for even times). Hence, the present technique can be implemented by removing or disabling the pulse extending circuitry so that instead the temporary clock signal generated by the clock generator is used for clocking the sequential logic. Hence, it may not be necessary to add any special mark space ratio adjustment circuitry to the clock supply circuitry, and in fact the clock generator for generating the clock for the present technique may be more efficient than known clock generators because it is not necessary to provide the pulse extending circuitry. On the other hand, in some circuits there may be some other logic which requires a clock signal with a 50% duty cycle and so in this case the clock generating circuitry may still have the pulse extending circuitry, but the clock signal for the at least one sequential logic element may be tapped at an earlier part of the clock generator before the pulse is extended.

Another way of generating a clock signal which is in the first state more often than the second state is to use clock gates. A clock gate can be included in the clock supply circuitry to hold the clock signal in the first state in which the sequential logic consumes less power. Hence, during periods when the sequential logic element does not need to change state, the clock can be gated in the first state so that static power consumption is reduced. Depending on whether the sequential logic is expected to consume less power in the high or low state of the clock signal, different forms of clock gate can be included in the circuit to hold the clock signal in the state which is most favourable for static power consumption.

The clock gate may receive an enable signal and when the enable signal has a predetermined state, the clock signal may be held in the first state. For example, the enable signal may implement a power saving mode. When the enable signal does not have a predetermined state, an input clock signal may be supplied by the clock gate to the sequential logic element so that the sequential logic element can be clocked and perform its regular function, but when the enable signal switches to the predetermined state, the clock signal is clamped to the first state so that the sequential logic element stops transitioning and remains in the preferred first state to reduce static power consumption.

In some cases the clock gating technique may be applied in combination with the technique of varying the duty cycle of the clock signal as discussed above. Hence, the input clock signal to the clock gate may itself be in the first state for a greater fraction of each clock cycle than the second state. In this case, leakage reduction may be achieved both in the active mode when the input clock signal is being supplied by the clock gate to the sequential logic, and in the power saving mode when the sequential logic is clamped permanently in the lower state by clamping the clock signal to the first state.

Alternatively, the clock gating could be applied with an input clock signal having a 50% duty cycle. In this case, the leakage reduction would apply only when in the power saving state when the clock gate is controlled to clamp the control signal to the first state. Since large portions of an integrated circuit may be power gated at any one time, this approach can still result in substantial leakage savings.

In some cases the sequential logic element may consume less power when the clock signal is high than when the clock signal is logic low. Hence, in this case the clock gate for that sequential logic may clamp the clock signal high during the power gating.

Viewed from another aspect, the present technique provides an integrated circuit comprising:

at least one sequential logic element means for generating an output signal in response to an input signal and a clock signal; and clock supply means for supplying the clock signal to the at least one sequential logic element means;

wherein in response to a first state of the clock signal, the at least one sequential logic element means is configured to consume less static power than in response to a second state of the clock signal; and the clock supply means is configured to supply the clock signal to the at least one sequential logic element means in the first state for a greater amount of time than the second state.

Viewed from a further aspect, the present technique provides a method of operating an integrated circuit comprising at least one sequential logic element, the method comprising:

supplying a clock signal to the at least one sequential logic element; and in response to the clock signal, the at least one sequential logic element generating an output signal in response to an input signal;

wherein in response to a first state of the clock signal, the at least one sequential logic element consumes less static power than in response to a second state of the clock signal; and the clock signal is supplied to the at least one sequential logic element in the first state for a greater amount of time than the second state.

Viewed from another aspect, the present technique provides a computer-implemented method of generating an integrated circuit design, the method comprising:

generating the integrated circuit design comprising a plurality of sequential logic elements configured to generate an output signal in response to an input signal and a clock signal;

selecting at least one sequential logic element from the plurality of sequential logic elements;

including in the integrated circuit design clock supply circuitry configured to supply the clock signal to the at least one sequential logic element in a first state for a greater amount of time than a second state, wherein in response to the first state of the clock signal, the at least one sequential logic element consumes less static power than in response to the second state of the clock signal.

Integrated circuits may be designed using a computer-implemented electronic design process. The design process can generate a circuit design so that it has the power saving benefits discussed above. When generating the design, sequential logic elements in the design can be selected as candidates for leakage reduction. Clock supply circuitry can then be included in the design so that the clock signal for the selected sequential logic elements will be in the first state for more time than the second state. For example, this can be achieved by including clock gates on the clock paths to clamp the clock signal to the lower-power first state, or by including circuitry in the clock generator or in a clock distribution tree for generating a clock signal which is in the first state for a greater fraction of a clock cycle than the second state.

Different sequential logic cells or technologies may have a different relationship between their inputs and the amount of static power consumption. Hence, the design method may include determining whether the selected sequential logic element consumes less static power in response to the logic high state of the clock signal or a logic low state of the clock signal. The clock supply circuitry included in the design may then be selected so that the first state which is favoured more often for the clock signal is the one of the logic high and logic low states for which the sequential logic will consume less static power. For example, a cell library used for the design method may have power consumption data defined for each cell, and this may be checked to see which one of the high and low states will cause least static power consumption. There may be a number of different types of clock gates or clock generators available for selection for inclusion in the design, depending on whether the particular cells being used consume less static power in response to the high or low state of the clock signal.

The design method may also include a step of identifying which sequential logic elements within the design should receive a clock signal in which the first state is used for a greater time than the second state. Not all sequential logic may be suitable for this. For example, some sequential logic may be clocked too fast which can make it awkward to provide control circuitry for adjusting the proportion of time in which the clock signals in the first state or the second state. Also, some sequential logic may be responsive to both edges of a clock signal rather than a single rising or falling edge, and in this case adjusting the duty cycle of a clock signal as discussed above may not be suitable. Therefore, the selection of sequential logic elements for clock level control may be based on these criteria.

The method of designing an integrated circuit may be implemented on a computer which may execute a computer program stored on a non-transitory computer readable recording medium. For example, the computer program may provide an electronic design automation (EDA) tool for generating the integrated circuit design.

Further aspects, features and advantages of the present technique will be apparent from the following description of examples, which is to be read in conjunction with the accompanying drawings.

DESCRIPTION OF EXAMPLES

Figure 1:
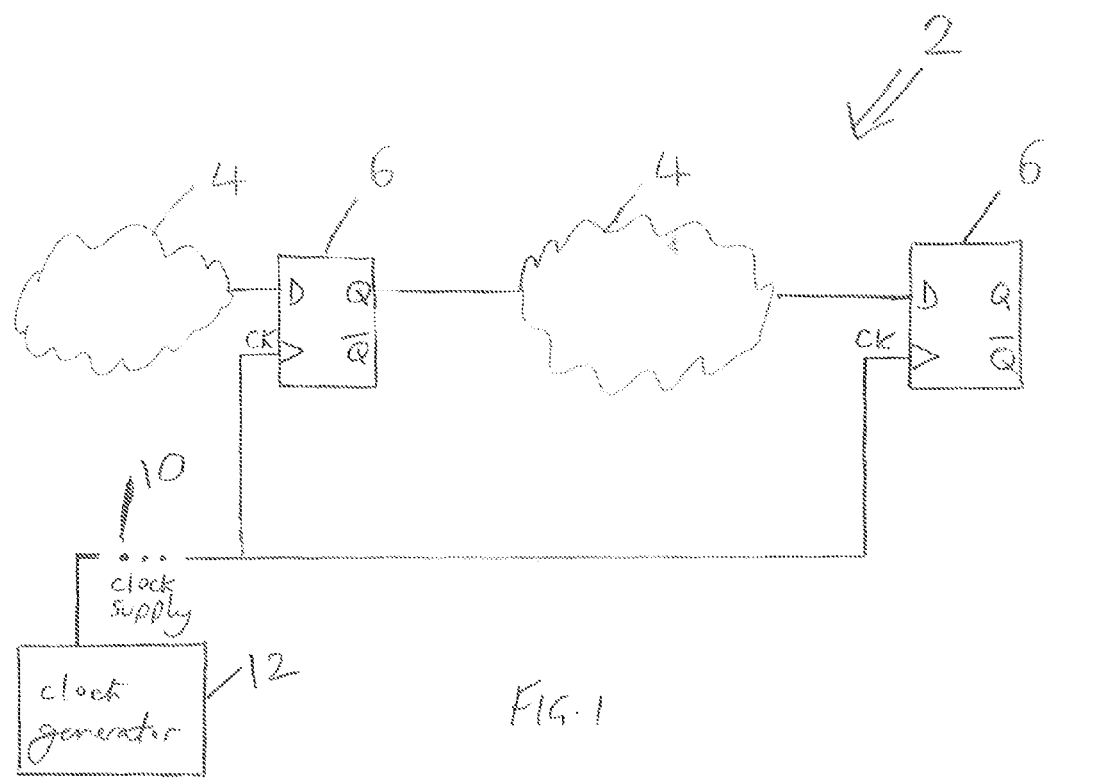
FIG. 1 schematically illustrates an integrated circuit with clock supply circuitry for supplying a sequential logic element with a clock signal in a first state for more time than a second state.

FIG. 1 illustrates a portion of an integrated circuit 2 according to one example. The integrated circuit 2 has some combinatorial logic 4, such as combinations of logic gates or inverters, and sequential logic 6, such as latches or flip-flops. In this example, the sequential logic 6 comprises D flip-flops. Sequential logic generates an output signal Q which depends not only on the input signal D but also on its previous output Q. With synchronous sequential logic, a clock signal drives the sequential logic and controls when the output signal transitions in response to the input signal. Typical integrated circuits may contain many thousands or even millions of D flip-flops or other sequential logic. As well as dynamic power consumption which increases with clock frequency due to losses each time the sequential logic switches state, the sequential logic also consumes static power when remaining in the same state. The present technique provides a technique for reducing the static power consumption.

A sequential logic element such as a D flip-flop may typically consume more static power when the clock signal is in one state than when the clock signal is in the other state. This relationship between the state of the clock signal and the static power consumption can be exploited to reduce leakage by controlling the clock signal supplied to the logic elements to reduce the amount of time for which the clock signal is in the higher power state. By replicating this for many flip-flops or other sequential logic elements across the integrated circuit 2, a significant power saving can be achieved.

FIG. 1 shows a first example of controlling the clock signal to be in the lower power state more often than the higher power state. In this example clock supply circuitry 10 is provided for routing the clock signal to the sequential logic element 6. For example the clock supply circuitry 10 may be a part of a clock tree or other clock distribution network. For example, the clock supply circuitry may include various buffers and clock gates for repeating the clock signal as it is propagated across the chip and for selectively turning on or off clock signals to a given regions of the integrated circuit. The circuit also includes a clock generator 12 for generating the clock signal and supplying it to the clock supply network 10. In other examples the clock generator 12 may be external to the integrated circuit and the clock supply circuitry 10 may receive a clock signal from the external clock generator 12.

Conventional integrated circuits use a clock signal having a duty cycle of 50%. This means that the clock signal is high for the same fraction of each cycle as the clock signal is low. The duty cycle is the fraction of one clock cycle that the clock signal is high, that is:

$$\text{duty cycle} = \frac{\text{time per cycle when clock signal is high}}{\text{duration of clock period}}$$

Another way of representing the duty cycle is the "mark space ratio":

$$\text{mark space ratio} = \frac{\text{time per cycle when clock signal is high}}{\text{time per cycle when clock signal is low}}$$

That is, when the clock signal is high and low for equal parts of the clock cycle, the duty cycle is 50% and the mark space ratio is 1.

The clock generator 12 generates a clock signal with a non-even duty cycle (i.e. a duty cycle that is not 50% or a mark space ratio that is not 1) so that the clock signal is in a first state in which the sequential logic 6 consumes less static power more often than in a second state in which the sequential logic 6 consumes more power. For example, for a particular library of cells and a given set of inputs, a D flip-flop 6 may consume around 13% lower static power when the clock is high than when the clock is low. Hence, as shown in the bottom clock signal of FIG. 2, in this case the clock signal could be generated with the high state for more of each cycle than the low state to exploit more of the static power saving. Similarly, if a particular type of sequential logic cell consumes more power in the clock high state than in the clock low state, then the duty ratio can be varied so that the clock signal is in the lower state for more time than the higher state in each cycle. This can provide significant savings. For example, if a D flip-flop consumes 10% less static power when the clock is higher than when low, then changing the clock mark space ratio from 50/50 to 75/25 would provide 5% less static power consumption. More aggressive scaling of the mark space ratio may be possible than 75/25.

Figure 3B:
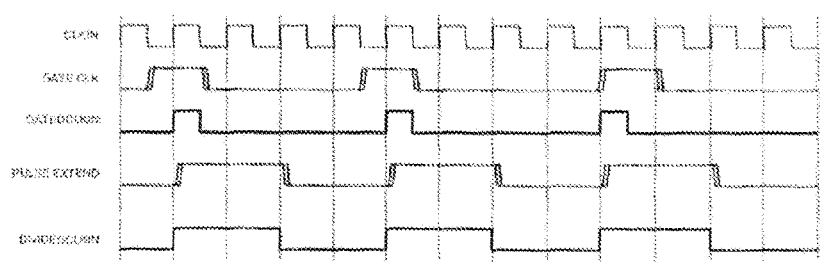
FIG. 3B illustrates signals within the clock divider of FIG. 3A.
Figure 3A:
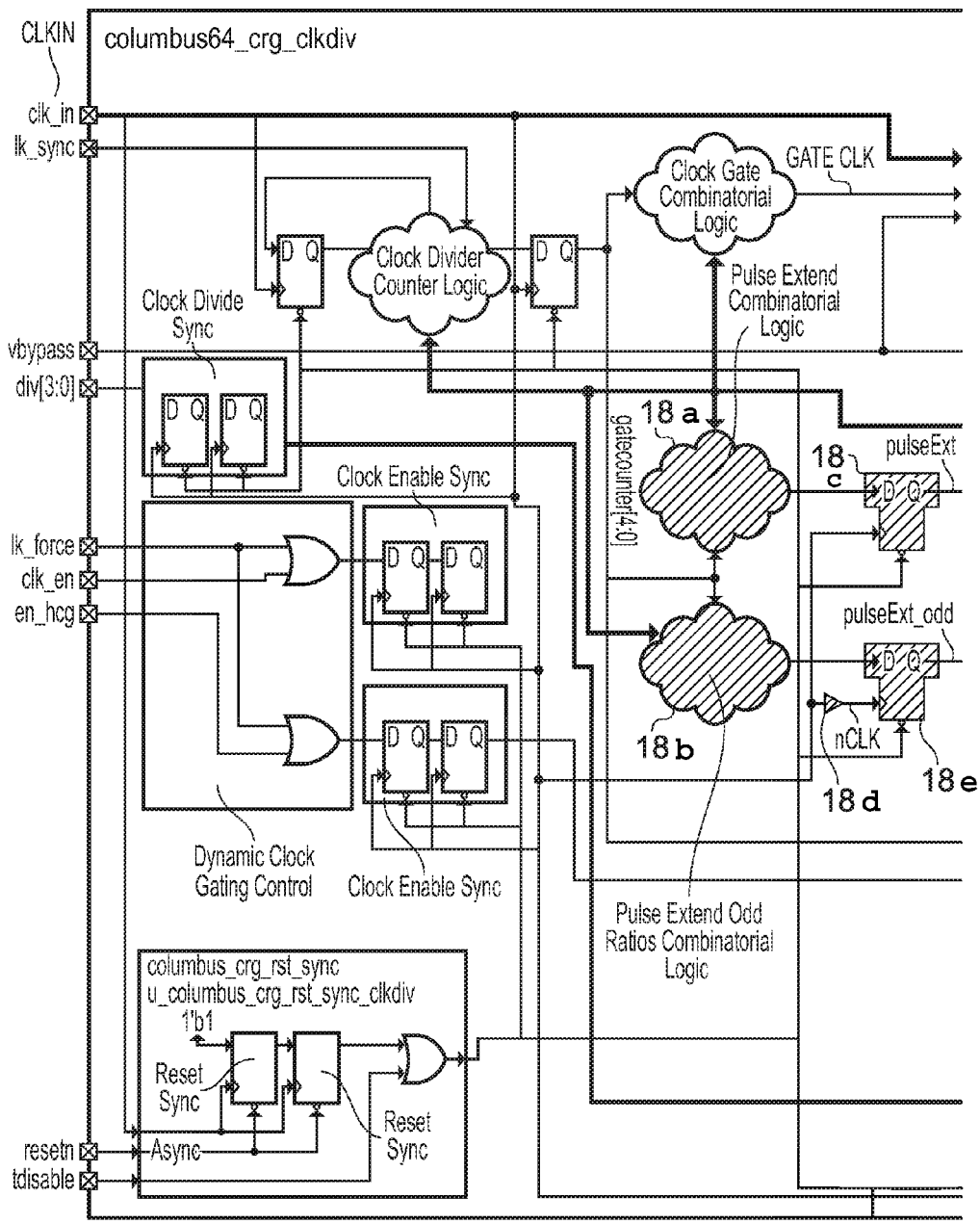
FIG. 3A illustrates an example of a clock divider for generating a clock signal.
Figure 3A:
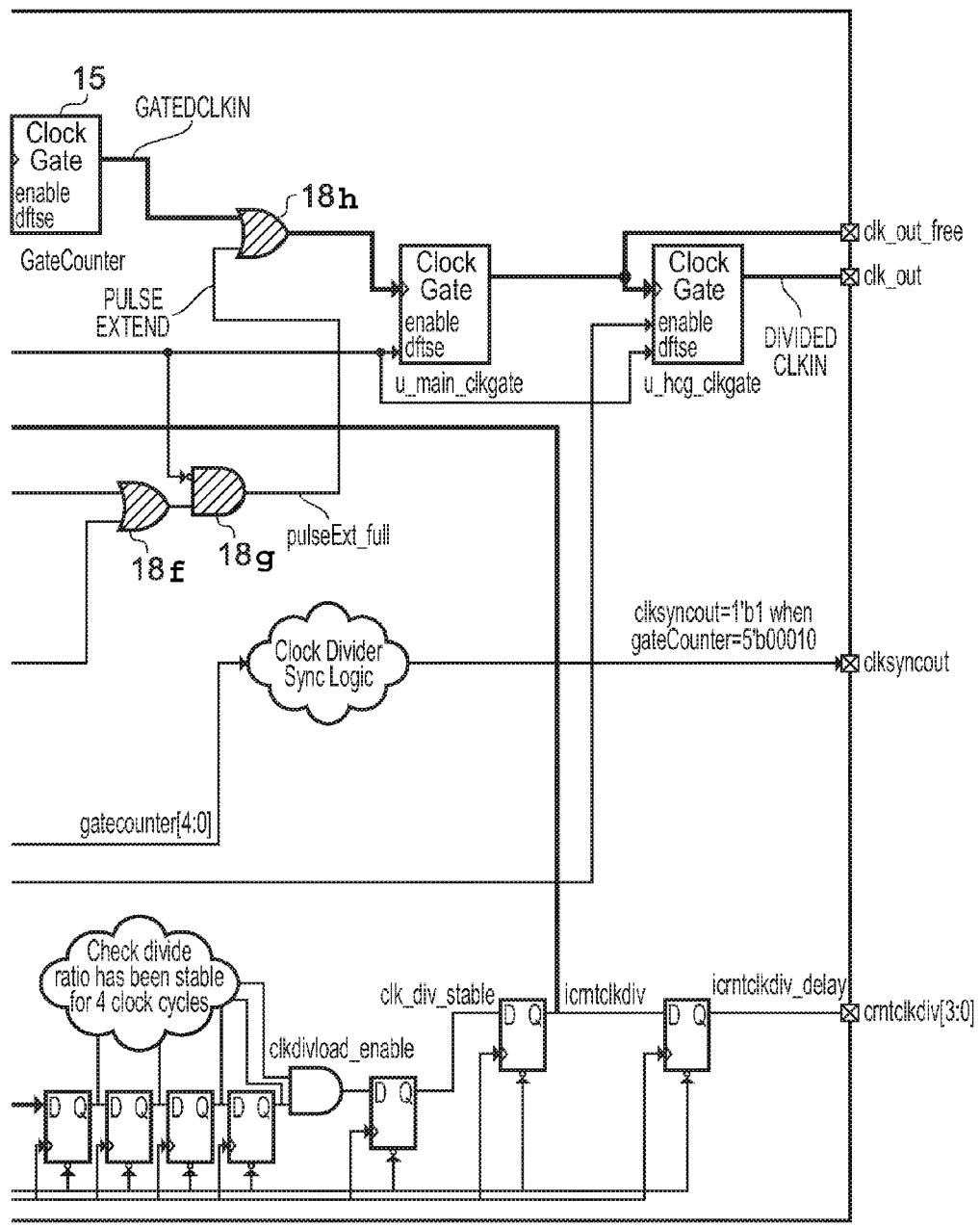

FIG. 3A shows an example of a typical clock divider for generating a clock signal for an integrated circuit. FIG. 3B is a timing diagram showing signals within the clock divider. The signals shown in FIG. 3B are labelled in capital letters in FIG. 3A. The clock divider receives an input clock signal CLKIN at a given frequency (e.g. received from an oscillator or phase locked loop) and generates a divided clock signal DIVIDEDCLKIN, which is output to other parts of the integrated circuit. The divided clock signal has a lower frequency than the input clock signal, corresponding to the frequency of the input clock signal divided by a certain "divide ratio" n. The clock divider includes a clock gate 15 which receives an enable signal (GATECLK) which selectively controls the clock gate 15 to pass or block clock pulses of the input signal from being propagated to the output clock signal. In this way, a lower frequency clock can be generated. However, as some of the pulses of the input clock signal are blocked, the resulting output clock signal has a duty cycle of less than 50% (see the signal GATEDCLKIN in FIG. 3B).

Therefore, the clock divider would typically have pulse extending circuitry 18*a*-*h* (shown in cross-hatching in FIG. 3A) for extending the width of the clock pulse of the gated clock signal GATEDCLKIN. The pulse extending circuitry 18*a*-*h* generates a pulse extending signal (PULSE EXTEND) which is combined with the gated clock signal GATEDCLKIN by a logical OR operation 18*h* and then input to another clock gate, which then generates the divided clock signal DIVIDEDCLKIN with a 50% duty ratio.

Hence, by eliminating the pulse extending circuitry 18*a*-*h* which would normally be provided (as well as any wiring connections to this circuitry 18*a*-*h*), the clock divider can generate a clock signal with a duty ratio less than 50%, which can be useful for power saving if the sequential logic element consumes less static power in the state when the clock signal is low.

For generating a clock signal with a duty ratio above 50% (which is high for a larger fraction of each clock cycle than it is low), a clock generator having negative edge triggered logic and a clock gate can be used. In this case, rather than selectively passing rising edges of the input clock signal as in FIGS. 3A and 3B, the negative edge triggered logic and clock gate could selectively pass falling edges so that when the clock gate is not enabled on a falling edge of the input clock signal, the clock signal stays high, so that the overall clock signal is high for longer than it is low.

It will be appreciated that there are many ways in which the clock signals having the non-50% duty cycle could be generated.

Figure 4:
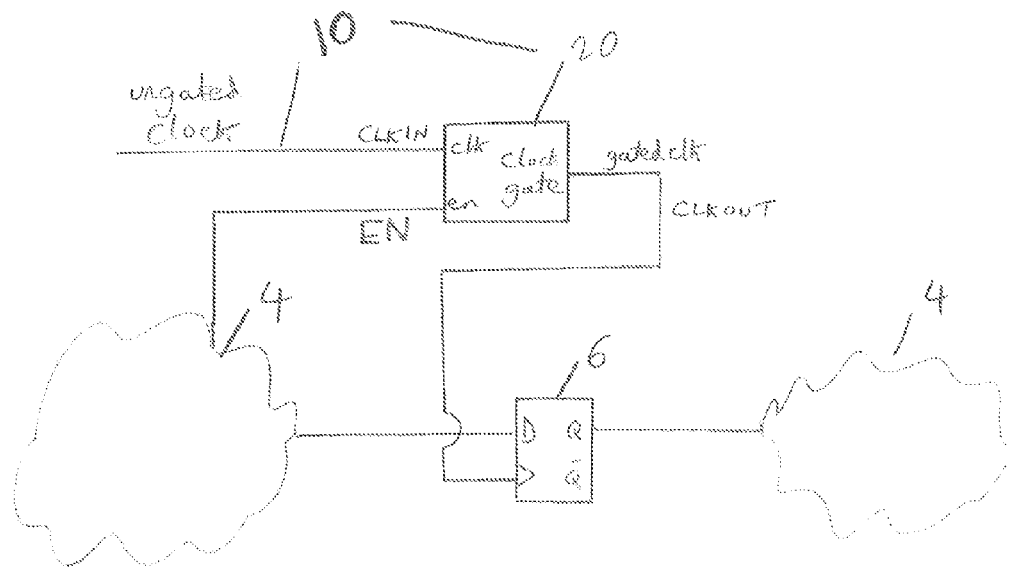
FIG. 4 illustrates an example of using a clock gate to clamp a clock signal for a sequential logic element to a selected value for leakage reduction.

FIG. 4 shows another technique for exploiting the properties of sequential logic to provide reduced power. In this case, a clock gate 20 is provided on the clock path for the sequential logic element 6. The clock path may be part of the clock tree for routing the clock signal from the clock generator to the sequential logic element 6. The clock gate 20 receives an input clock signal, which may either have a 50% duty ratio, or may have a duty ratio other than 50% which favours the state in which the sequential logic element 6 consumes less power, as in the example of FIGS. 1 and 2. The clock gate 20 also receives an enable signal EN which may be generated by some of the combinatorial logic 4. The enable signal selects whether the sequential logic element 6 is in a normal mode in which the clock gate routes the input clock signal to the sequential logic element 6, or a power saving mode in which the clock is clamped to a fixed state to prevent switching of the sequential logic element 6.

Figure 5:
FIG. 5 shows some timing examples showing an example of clamping the clock signal low or high respectively.
Figure 5:
Figure 5:
Figure 5:
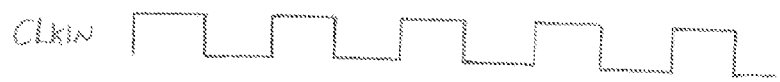
Figure 5:
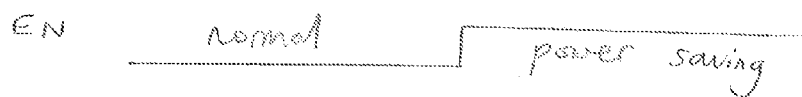
Figure 5:

As shown in FIG. 5, different types of clock gate 20 may be provided to either clamp the clock for the sequential logic element 6 to a low value or to a high value, depending on which state achieves reduced static power consumption at the sequential logic 6. If the sequential logic 6, consumes less static power when the clock is low, then as shown in the top part of FIG. 5 the clock gate 20 may be provided with an AND gate to combine the input clock signal with the enable signal in a logical AND operation. This means that when the enable signal is high then the input clock signal is propagated through to the sequential logic 6 but when the enable signal drops low than the output clock signal supplied to the sequential logic is clamped low. On the other hand, if the sequential logic 6 consumes less static power when the clock is high then an OR gate can be used for the clock gate 20. This combines the input clock signal and enable signal using a logical OR operation so that when the enable signal is low the input clock is propagated through as the output clock but when the enable signal rises high then the output clock is clamped high. Hence, depending on the particular technology used for the sequential logic element 6, one of these types of clock gates can be selected so that during the power saving mode the sequential logic 6 consumes less power.

As shown in FIG. 5, when different types of clock gates are used, this may cause the enable signal to be latched on different edges of the input clock signal. That is, when clamping low, the enable signal may be latched on a rising edge of the input clock signal while when clamping high the enable signal may be latched on a falling edge. This may cause timing constraints in the circuit since the combinatorial logic 4 which generates the enable signal may be clocked by rising edges of the input clock signal and so if triggering the enable to the clock gate on a falling edge then this may reduce the time available for the combinatorial logic 4 to generate the enable signal. Hence, there may sometimes be some timing issues with some particular cells and so the circuit designer may avoid applying this technique for such cases and restricted the power saving to sequential logic where the timing paths are more suitable, or may insert extra buffers into the design to ensure that timing requirements are met.

Figure 2:
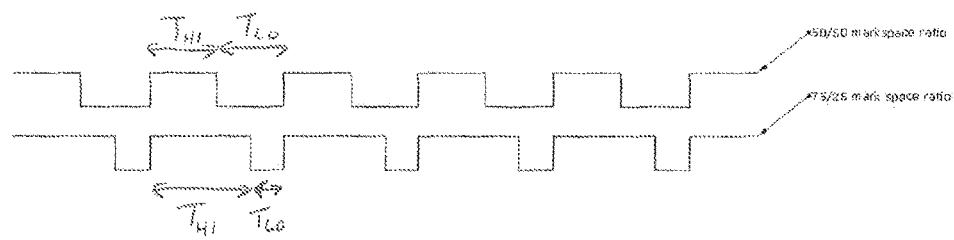
FIG. 2 illustrates clock signals with different duty cycles.

There may be other types of cells for which it is not possible to modify the duty cycle as shown in FIGS. 1 and 2. For example, some flip flops or other sequential logic elements may be triggered by both rising and falling edges in which case modifying the duty cycle as shown in FIG. 2 may cause incorrect operation. Therefore this technique could be restricted for single edge triggered sequential logic. Clocking rates, pulse width issues or other timing critical design rules which may also affect whether the duty cycle can be modified. Therefore, it is not necessary for all sequential logic within the integrated circuit to use the techniques described above.

Figure 6:
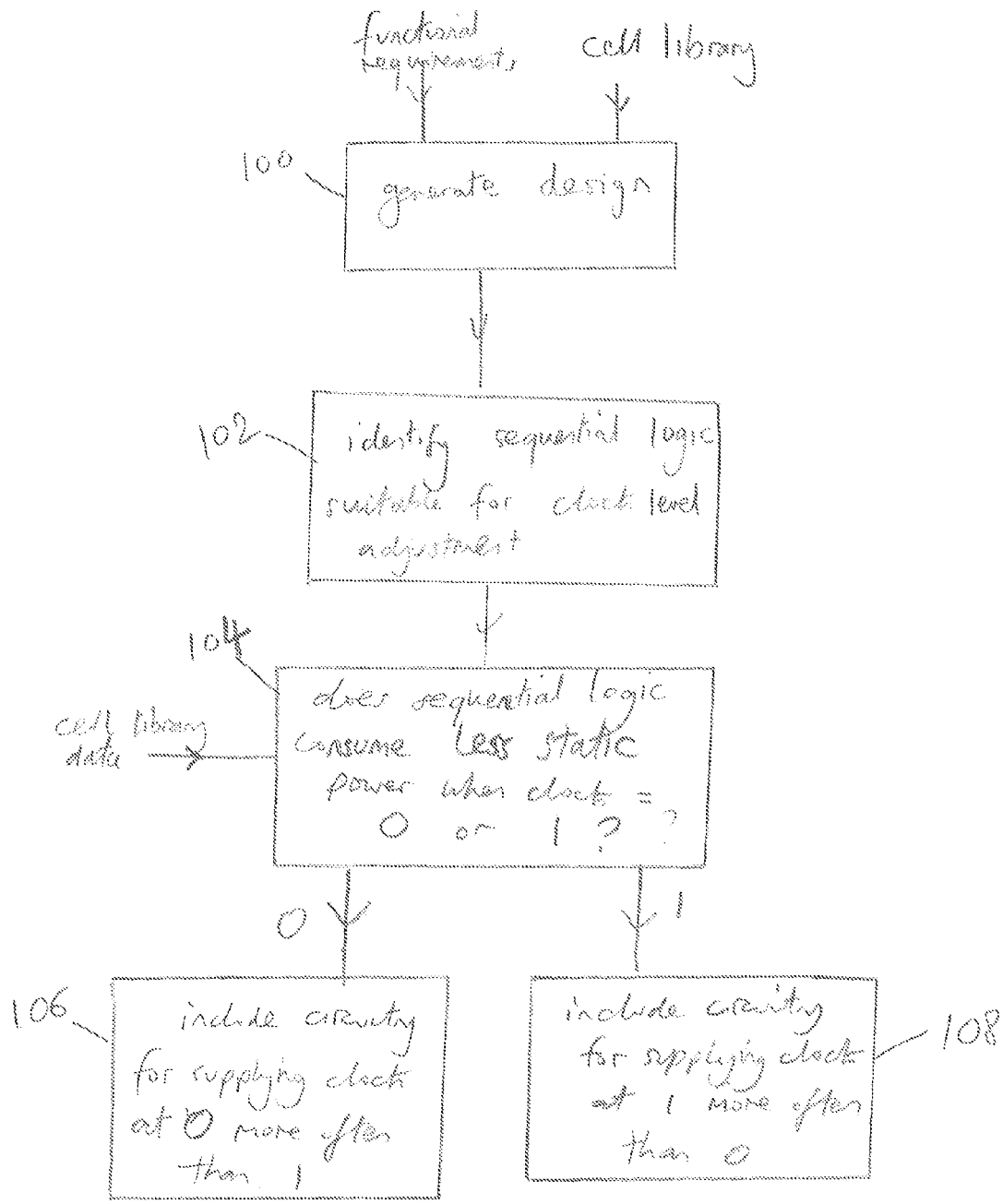
FIG. 6 illustrates a method of generating an integrated circuit design.
Figure 7:
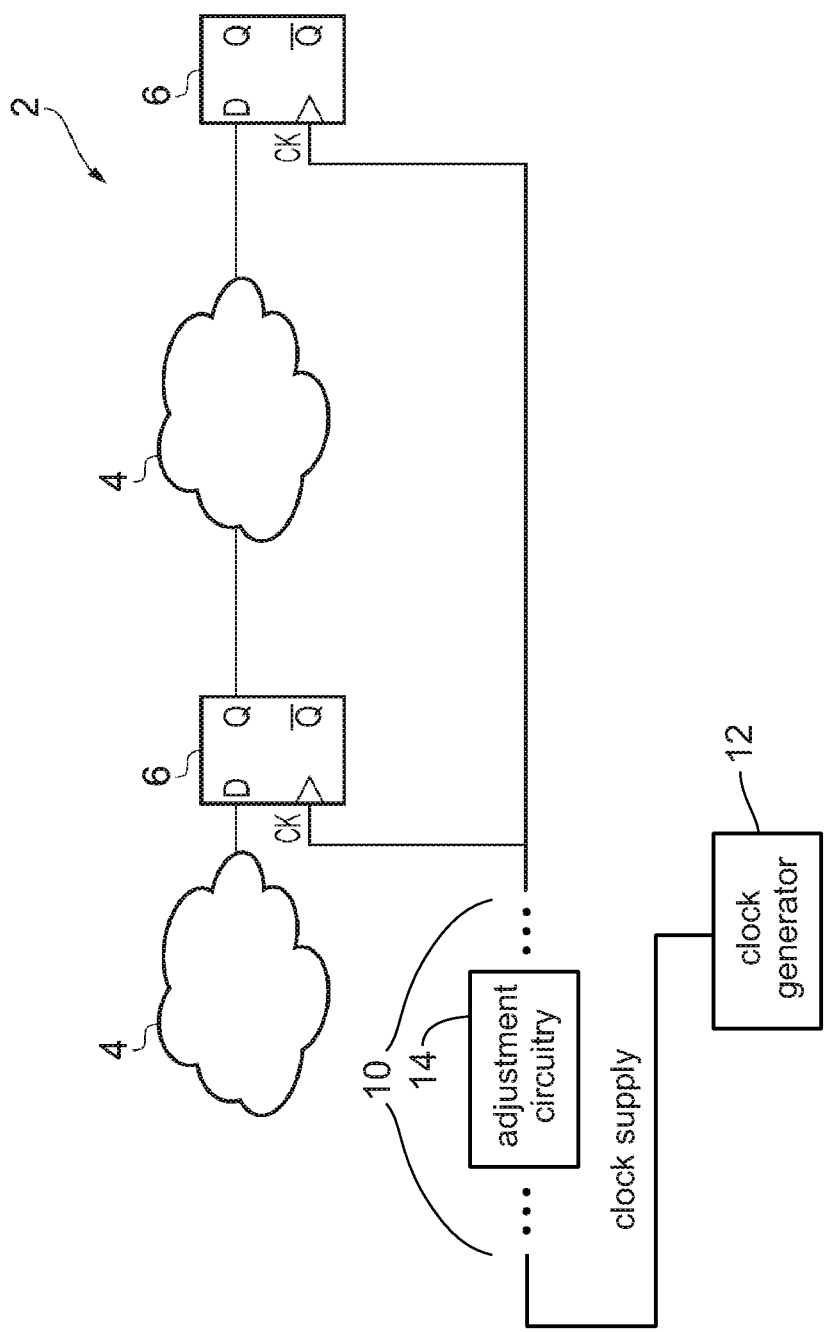
FIG. 7 schematically illustrates another technique for supplying a sequential logic element with a clock signal in a first state for more time than a second state.

FIG. 6 shows a method of designing an integrated circuit design. This method can be performed using an electronic design automation tool (EDA tool) executing on a general purpose computer. The EDA tool may have a cell library which provides a library of standard cells representing circuit components which can be selected for inclusion in an integrated circuit design. The circuit designer may specify functional requirements of the circuit, for example defining what functions the circuit should carry out, and the EDA tool may select cells from the cell library and generates connections between cells to meet these functional requirements, to generate an integrated circuit layout at step 100 of FIG. 6. At this point a design may include many sequential logic elements such as flip flops 6. At step 102, the EDA tool may (automatically or with input from the person using the EDA tool) identify which sequential logic elements are suitable for clock level adjustment, e.g. based on the types of factors described in the previous paragraph. At step 104 it is determined whether the selected sequential logic consumes less static power when the clock signal to those elements is 0 or 1. This may be determined based on cell library data defining power consumption characteristics of the specific logic cells. If the sequential logic consumes less static power when the clock signal is 0 then at step 106 the EDA tool modifies the design to include clock supply circuitry for supplying the clock signal at the logic low level 0 more often than the logic high level 1. If the cell consumes less power when the clock signal is 1 then it is the other way round and at step 108 the clock supply circuitry is included to supply the clock signal at the logic high level 1 more often than logic low 0. For example, steps 106 and 108 may include defining the clock signal to have a different mark space ratio, including clock generating circuitry or circuitry within the clock tree for generating the clock signal with the adjusted mark space ratio or including clock gates in the integrated circuit design for clamping the clock signal to the level expected to cause lower static power consumption.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. An integrated circuit comprising:
   at least one sequential logic element; and
   clock supply circuitry configured to supply a clock signal to the at least one sequential logic element, wherein the clock supply circuitry comprises at least one clock gate configured to:
     receive an enable signal; and
     receive an input clock signal, wherein the input clock signal is in a first state of the input clock signal for a greater fraction of each clock cycle than a second state of the input clock signal;
   wherein in response to a first state of the clock signal, the at least one sequential logic element is configured to consume less static power than in response to a second state of the clock signal; and
   wherein the clock supply circuitry is configured to supply the first state of the clock signal to the at least one sequential logic element for a greater amount of time than the second state of the clock signal.

2. The integrated circuit according to claim 1, wherein in response to the first state of the clock signal, the at least one sequential logic element is configured with fewer transistors in an active state than in response to the second state of the clock signal.

3. The integrated circuit according to claim 1, wherein the at least one sequential logic element comprises at least one D flip-flop.

4. The integrated circuit according to claim 1, comprising at least one other sequential logic element supplied with another clock signal which is not in the first state of the clock signal for a greater amount of time than the second state of the clock signal.

5. The integrated circuit according to claim 1, wherein the clock supply circuitry is configured to supply the first state of the clock signal for a greater fraction of a clock cycle than the second state of the clock signal.

6. The integrated circuit according to claim 1, wherein the clock supply circuitry comprises clock generating circuitry configured to generate the clock signal in the first state for a greater fraction of a clock cycle than the second state.

7. The integrated circuit according to claim 1, wherein the clock supply circuitry comprises mark space ratio adjustment circuitry configured to adjust a mark space ratio of the clock signal so that the clock signal is in the first state for a greater fraction of a clock cycle than the second state.

8. The integrated circuit according to claim 6, wherein the clock generating circuitry is configured to output the clock signal generated by the clock generating circuitry directly to the clock supply circuitry without adjusting a mark space ratio of the clock signal.

9. The integrated circuit according to claim 1, wherein the at least one clock gate is further configured to hold the clock signal in the first state.

10. The integrated circuit according to claim 9, wherein the at least one clock gate is further configured to hold the clock signal in the first state if the enable signal has a predetermined state.

11. The integrated circuit according to claim 10, wherein if the enable signal does not have the predetermined state, then the at least one clock gate is further configured to supply the input clock signal to the at least one sequential logic element.

12. The integrated circuit according to claim 1, wherein the fraction of each clock cycle in which the input clock signal is in the first state is equal to the fraction of each clock cycle in which the input clock signal is in the second state.

13. The integrated circuit according to claim 9, wherein the first state comprises a logic high state of the clock signal.

14. An integrated circuit comprising:
   means for generating an output signal in response to an input signal and a clock signal, wherein the means for generating includes at least one sequential logic element; and
   means for supplying the clock signal to the at least one sequential logic element means, wherein the means for supplying the clock signal comprises at least one clock gate configured to:
     receive an enable signal; and
     receive an input clock signal, wherein the input clock signal is in a first state of the input clock signal for a greater fraction of each clock cycle than a second state of the input clock signal;
   wherein in response to a first state of the clock signal, the at least one sequential logic element is configured to consume less static power than in response to a second state of the clock signal; and
   wherein the means for supplying the clock signal is configured to supply the first state of the clock signal to the at least one sequential logic element for a greater amount of time than the second state of the clock signal.

15. A method of operating an integrated circuit comprising at least one sequential logic element, the method comprising:
   supplying a clock signal, by a clock supply circuitry, to the at least one sequential logic element, wherein the clock supply circuitry comprises at least one clock gate configured to:
     receive an enable signal; and receive an input clock signal, wherein the input clock signal is in a first state of the input clock signal for a greater fraction of each clock cycle than a second state of the input clock signal;

in response to the clock signal, the at least one sequential logic element generating an output signal in response to an input signal;

wherein in response to a first state of the clock signal, the at least one sequential logic element consumes less static power than in response to a second state of the clock signal; and the first state of the clock signal is supplied to the at least one sequential logic element for a greater amount of time than the second state of the clock signal.

16. A computer-implemented method of generating an integrated circuit design, the method comprising:

generating the integrated circuit design comprising a plurality of sequential logic elements configured to generate an output signal in response to an input signal and a clock signal;

selecting at least one sequential logic element from the plurality of sequential logic elements;

including in the integrated circuit design clock supply circuitry configured to supply a first state of the clock signal to the at least one sequential logic element for a greater amount of time than a second state of the clock signal, wherein the clock supply circuitry comprises at least one clock gate configured to:

receive an enable signal; and receive an input clock signal, wherein the input clock signal is in a first state of the input clock signal for a greater fraction of each clock cycle than a second state of the input clock signal; and wherein in response to the first state of the clock signal, the at least one sequential logic element consumes less static power than in response to the second state of the clock signal.

17. The method of claim 16, comprising a step of determining whether the at least one sequential logic element consumes less static power in response to a logic high state of the clock signal or a logic low state of the clock signal;

wherein the first state of the clock signal is one of the logic high state and the logic low state in which the at least one sequential logic element is determined to consume less static power.

18. The method of claim 16, comprising determining which of the plurality of sequential logic elements are suitable for receiving a first state of clock signal for a greater amount of time than the second state of clock signal; and wherein said at least one sequential logic element comprises the sequential logic elements determined to be suitable for receiving the first state of clock signal for a greater amount of time than the second state of clock signal.

19. A non-transitory computer-readable recording medium configured to store a computer program which, when executed on a computer, controls the computer to perform the method of claim 16.

* * * * *